United States Patent
Ahn et al.

(10) Patent No.: US 9,007,819 B2
(45) Date of Patent: Apr. 14, 2015

(54) MAGNETIC RANDOM ACCESS MEMORY DEVICE AND METHOD OF WRITING DATA THEREIN

(75) Inventors: Su-Jin Ahn, Hwaseong-si (KR); Kyung-Tae Nam, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 392 days.

(21) Appl. No.: 13/532,811

(22) Filed: Jun. 26, 2012

(65) Prior Publication Data

US 2012/0327707 A1 Dec. 27, 2012

(30) Foreign Application Priority Data

Jun. 27, 2011 (KR) .................. 10-2011-0062340

(51) Int. Cl.
*G11C 11/00* (2006.01)
*G11C 11/16* (2006.01)

(52) U.S. Cl.
CPC .................................. *G11C 11/1675* (2013.01)

(58) Field of Classification Search
CPC ......... G11C 11/14; G11C 11/15; G11C 11/16
USPC .................. 365/148, 158, 171, 173
See application file for complete search history.

(56) References Cited

U.S. PATENT DOCUMENTS

| | | | | |
|---|---|---|---|---|
| 8,259,511 B2 * | 9/2012 | Cho et al. | ................. | 365/189.05 |
| 2008/0025081 A1 * | 1/2008 | Cho et al. | ................. | 365/163 |
| 2008/0062753 A1 * | 3/2008 | Cho et al. | ................. | 365/163 |
| 2009/0180312 A1 | 7/2009 | Miura et al. | | |
| 2010/0214831 A1 | 8/2010 | Kim et al. | | |
| 2010/0220518 A1 * | 9/2010 | Zheng et al. | ................. | 365/158 |
| 2010/0226167 A1 | 9/2010 | Kajiyama | | |
| 2012/0307547 A1 * | 12/2012 | Park et al. | ................. | 365/148 |

FOREIGN PATENT DOCUMENTS

| | | |
|---|---|---|
| JP | 2009-152258 | 7/2009 |
| JP | 2010-205335 | 9/2010 |
| KR | 1020100097407 A | 9/2010 |

* cited by examiner

*Primary Examiner* — Han Yang
(74) *Attorney, Agent, or Firm* — Renaissance IP Law Group LLP

(57) ABSTRACT

In a method of writing data in an MRAM device, a first operation unit is selected in a plurality of memory cells of the MRAM device. First to n-th switching pulses are sequentially applied to the first operation unit to write data in first to n-th groups of memory cells of the first operation unit, respectively. The n-th switching pulse may have a current level lower than that of an (n−1)th switching pulse, where n is an integer larger than at least 1. The n-th switching pulse may have a pulse width narrower than that of an (n−1)th switching pulse, where n is an integer larger than at least 1. The technique can be repeated for a second operation unit. A device and system are disclosed in which different current switching pulses are applied to multiple groups of memory cells within the first and/or second operation units.

18 Claims, 9 Drawing Sheets

MAGNETIC RANDOM ACCESS MEMORY DEVICE AND METHOD OF WRITING DATA THEREIN

CROSS-REFERENCE TO RELATED APPLICATION

This application claims priority under 35 USC §119 to Korean Patent Application No. 10-2011-0062340 filed on Jun. 27, 2011 in the Korean Intellectual Property Office (KIPO), the entire disclosure of which is incorporated herein by reference.

BACKGROUND

1. Technical Field

Example embodiments relate to a magnetic memory device and a method of writing date therein. More particularly, example embodiments relate to a spin transfer torque magnetic random access memory (STT-MRAM) device and a method of writing data therein.

2. Description of the Related Art

An STT-MRAM device includes memory cells. Each memory cell may have a free layer pattern, which together with other sequentially stacked layers, are configured to store bit data. In the STT-MRAM device, currents may be applied to change a magnetization direction of the free layer pattern so that the data may be written in a given memory cell. Currents having the necessary qualities to successfully change the magnetization direction of the free layer pattern are referred to as switching currents.

FIG. 1 is a circuit diagram illustrating cell arrays of a conventional STT-MRAM device. Each memory cell may include a selection transistor 102 and a magnetic tunnel junction (MTJ) structure 104. The memory cells may be connected to each other by word lines (e.g., W/L) and bit lines (e.g., B/L). For example, the word lines may be coupled to gates of the respective selection transistors 102. The bit lines may be coupled to the MTJ structures 104, which are coupled to the drains of the respective selection transistors 102.

Currents or voltages may be applied to the word lines and/or the bit lines. By controlling such currents or voltages, a resistance of the MTJ structure 104 may be changed, which represents different data stored by or otherwise written to the memory cell. For example, when the resistance of the MTJ structure 104 is switched to a high value, the memory cell may be understood to store a "1" value. Conversely, when the resistance of the MTJ structure 104 is switched to a relatively lower value, the memory cell may be understood to store a "0" value. It will be understood that this is one convention. In another convention, a high resistance may correspond to a "0" value and a relatively lower resistance may correspond to a "1" value.

Due to the distribution characteristics of memory cells in the STT-MRAM device, switching currents that are capable of successfully changing magnetization directions of free layer patterns are not necessarily the same from one memory cell to the next, or from one group of memory cells to another group of memory cells. For example, when a switching current is applied to particular memory cells, the data stored in the particular memory cells may be successfully switched only when the switching current is higher or lower than usual. In other words, different memory cells may need a different switching current for successfully changing a magnetization direction of a free layer pattern. Otherwise, when the qualities of the applied currents are insufficient or ineffective at changing a magnetization direction of the free layer pattern, operation failure may occur. In some failure cases, no new data may be written in the memory cells. Accordingly, a device and method is needed for applying a proper switching current having the qualities for successfully changing a magnetization direction of a free layer pattern associated with diverse STT-MRAM memory cells.

SUMMARY

Example embodiments provide a device, system, and method for exactly writing data in an MRAM device.

Example embodiments provide an MRAM device in which data may be exactly written therein.

Example embodiments include a method of writing data in an MRAM device. In the method, a first operation unit is selected in a plurality of memory cells of the MRAM device. First to n-th switching pulses are sequentially applied to the first operation unit to write data in first to n-th groups of memory cells of the first operation unit, respectively. The n-th switching pulse has a current level lower than that of an (n−1)th switching pulse, and n is an integer larger than at least 1.

In example embodiments, the first to n-th memory cells may have different current levels from each other.

In example embodiments, a second operation unit may be selected in the plurality of memory cells of the MRAM device. First to n-th switching pulses may be sequentially applied to the second operation unit to write data in first to n-th groups of memory cells of the second operation unit, respectively. The n-th switching pulse may have a current level lower than that of an (n−1)th switching pulse, and n may be an integer larger than at least 1.

In example embodiments, the integer n may be experimentally determined or otherwise set by an experiment on the MRAM device.

In example embodiments, the current level of the first to n-th switching pulse may be experimentally determined or otherwise set by an experiment on a difference between current levels required for writing data in the first to n-th groups of memory cells.

In example embodiments, the current level of the first switching pulse may be equal to or higher than a current level required for writing data in any memory cell of the first group of memory cells, and the current level of the n-th switching pulse may be equal to or lower than a current level required for writing data in any memory cell of the n-th group of memory cells.

In example embodiments, the switching pulse may be a current pulse.

In example embodiments, the first to n-th switching pulses may have substantially the same pulse width.

In example embodiments, the n-th switching pulse may have a pulse width narrower than that of the (n−1)th switching pulse.

In example embodiments, the first operation unit may include a plurality of memory cells connected to substantially the same word line.

In example embodiments, the first operation unit may include a plurality of memory cells connected to substantially the same bit line.

Example embodiments include an MRAM device. The MRAM device may include a memory cell array, an address designation circuit, an input/output circuit, and/or a control circuit. The memory cell array includes a plurality of memory cells. The address designation circuit designates an address of an operation unit including some of the memory cells. The input/output circuit writes data in the operation unit. The control circuit controls the input/output circuit to sequentially apply first to n-th switching pulses to the operation unit so that data is written in first to n-th groups of memory cells of the operation unit, respectively. The n-th switching pulse has a current level lower than that of an (n−1)th switching pulse, and n is an integer larger than at least 1.

According to example embodiments, data may be exactly written in memory cells even though there is a distribution of electrical characteristics therebetween. Moreover, back hopping may be prevented.

BRIEF DESCRIPTION OF THE DRAWINGS

Example embodiments will be more clearly understood from the following detailed description taken in conjunction with the accompanying drawings. FIGS. 1 to 9 represent non-limiting, example embodiments as described herein.

FIG. 1 is a circuit diagram illustrating cell arrays of a conventional STT-MRAM device;

FIG. 5 illustrates switching current pulses applied to memory cells of an STT-MRAM device in accordance with example embodiments;

FIG. 6 illustrates switching current pulses applied to memory cells of an STT-MRAM device in accordance with example embodiments;

FIG. 7 is a block diagram illustrating an STT-MRAM device in accordance with example embodiments;

FIG. 8 is a block diagram illustrating a control voltage generation circuit included in the voltage generator of FIG. 7; and FIG. 9 is a block diagram of a system including the STT-MRAM device in accordance with example embodiments.

DETAILED DESCRIPTION OF THE EMBODIMENTS

Figure 1:
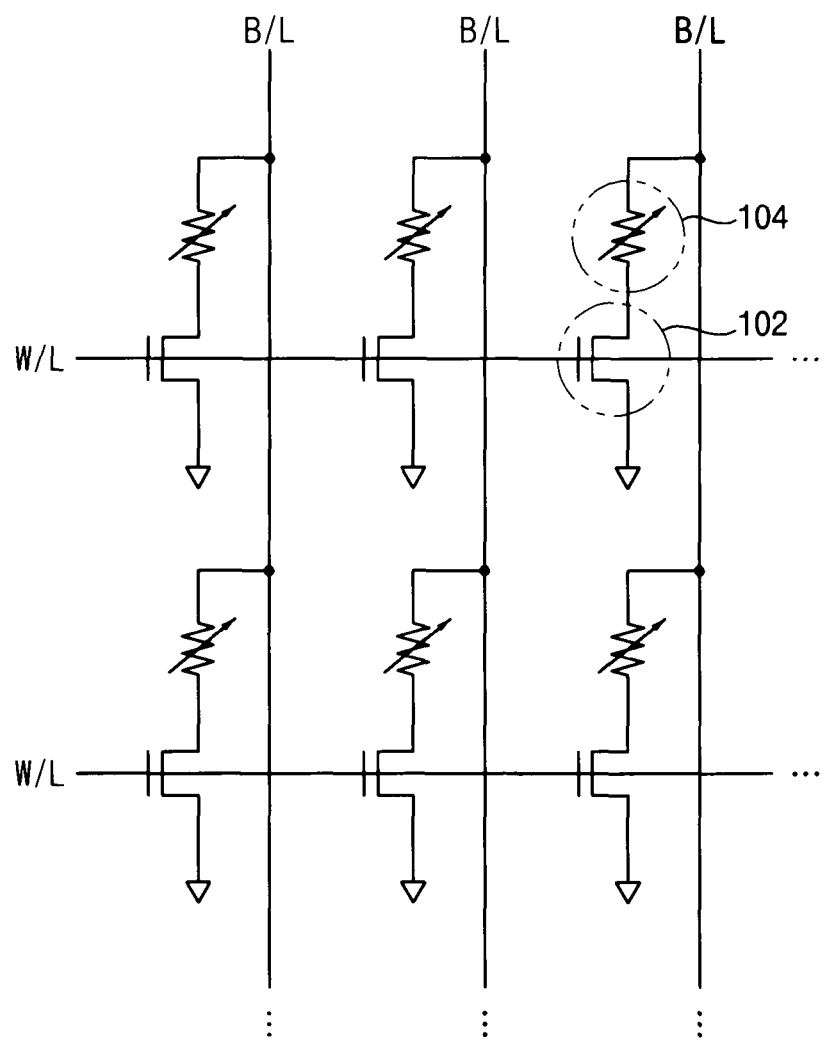

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Figure 2A:
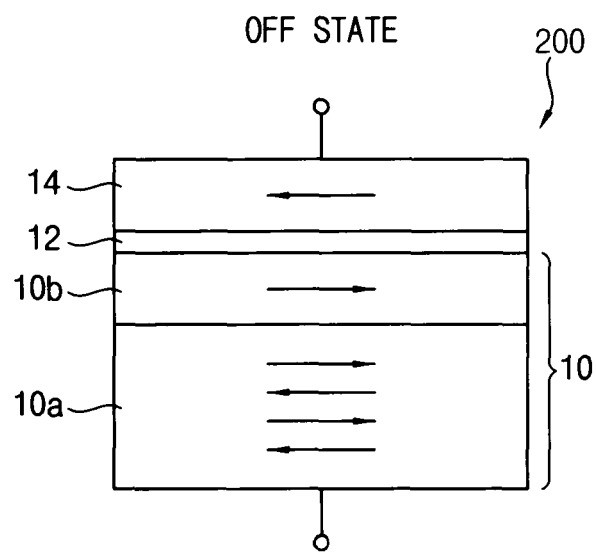
FIGS. 2A and 2B illustrate data status of an MTJ structure in an STT-MRAM device.
Figure 2B:
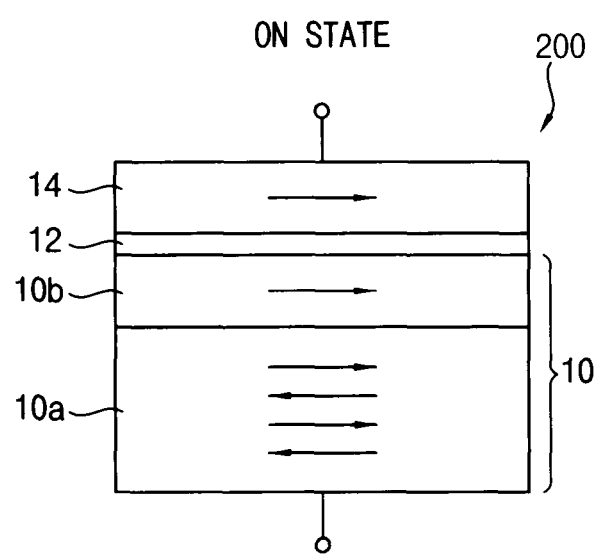

FIGS. 2A and 2B illustrate data status of an example MTJ structure 200, which may be included in an STT-MRAM device.

Referring to FIGS. 2A and 2B, the MTJ structure 200 may include a fixed layer 10, a tunnel barrier layer 12 and a free layer 14. The layers may be sequentially stacked or otherwise adjacent one with another. The fixed layer 10 may have a pinning layer 10a and a pinned layer 10b. The pinning layer 10a may be used for fixing the magnetic orientation of the pinned layer 10b.

When a current is applied to the MTJ structure 200 in a memory cell, a magnetization direction of the free layer 14 may be reversed so that new data may be written in the memory cell. More specifically, when a switching current is applied to the memory cell, a spin polarity of the free layer 14 may be aligned to be parallel to that of the pinned layer 10b, e.g., as shown in FIG. 2B, so that the memory cell may be in an on-state, or in other words, the memory cell may be in a low resistance state. Conversely, the spin polarity of the free layer 14 may be aligned to be anti-parallel to that of the pinned layer 10b, e.g., as shown in FIG. 2A, so that the memory cell may be in an off-state, or in other words, the memory cell may be in a high resistance state. Put differently, when the memory cell is in the off-state, the MTJ structure may have a relatively high resistance, and when the memory cell is in the on-state, the MTJ structure may have a relatively low resistance. As described above, a switching current having a proper level or value for the magnetization direction reversal may be applied to the memory cell so that data may be written therein.

However, the memory cells in the STT-MRAM device may have different switching currents from each other. In other words, the qualities of currents for successfully changing a magnetization direction of a free layer pattern may be different according to various memory cells as a result of the distribution of the memory cells or other subtle manufacturing differences. For example, different switching currents may be required for successful reversal of magnetization direction of free layers in different memory cells. That is, a current level or value of switching currents of the memory cells may have a certain distribution according to the location, thickness of a tunnel barrier layer, and the like. By way of another example, if an excessive current is applied to a memory cell for which even a low current is enough for the magnetization direction reversal, the magnetization direction of a free layer of the memory cell may be excessively reversed so that data may not be properly written therein.

Hereinafter, a method of writing data in memory cells having different electrical characteristics, e.g., different switching currents, is illustrated with reference to FIGS. 3A and 3B.

Figure 3A:
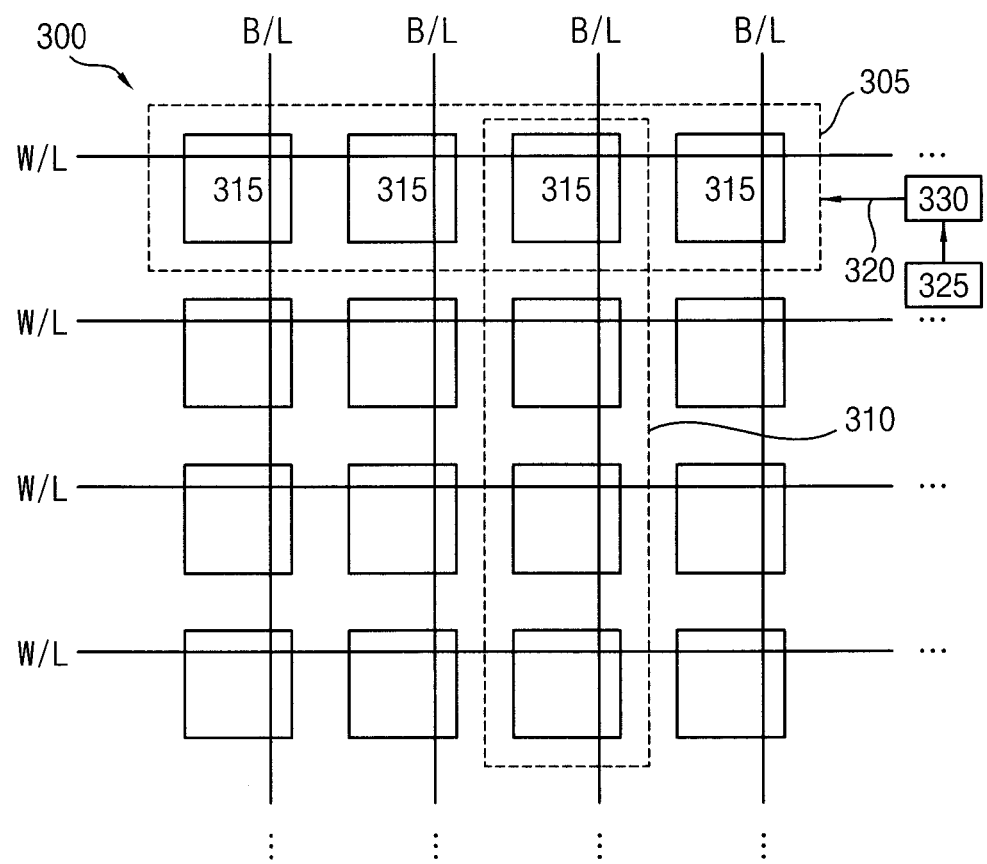
FIGS. 3A and 3B illustrate switching current pulses applied to memory cells of an STT-MRAM device in accordance with example embodiments.
Figure 3B:
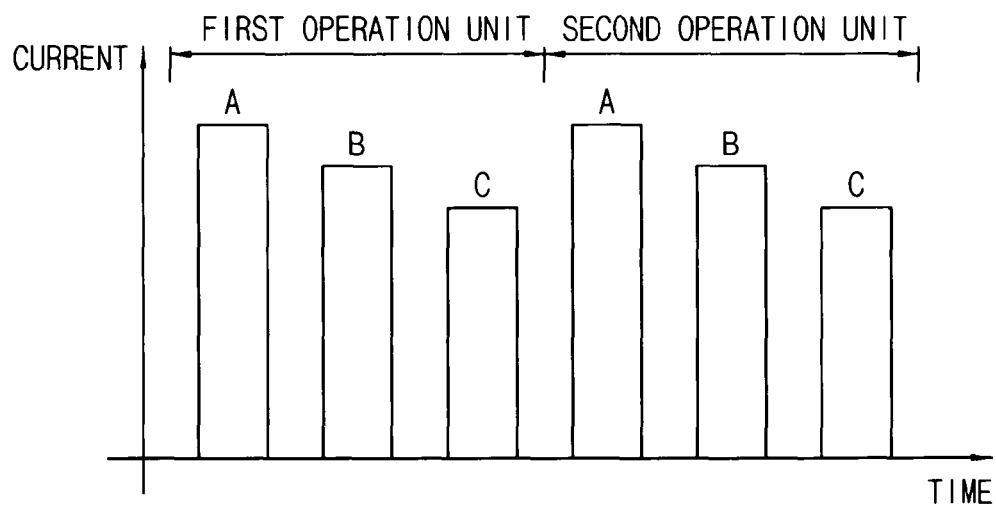

FIGS. 3A and 3B illustrate switching current pulses, which may be applied to memory cells of an STT-MRAM device in accordance with example embodiments.

Referring to FIG. 3A, data may be written in an operation unit such as operation unit 305 or operation unit 310. Each operation unit may include a plurality of memory cells (e.g., 315) of an STT-MRAM device (e.g., 300). Data may be simultaneously written in the plurality of memory cells included in the same operation unit. Additionally, data may be written in other operation units sequentially so that data may be written in all memory cells of the STT-MRAM device 300. The operation unit may be, e.g., a plurality of memory cells electrically connected to the same word line (e.g., W/L) or bit line (e.g., B/L). By way of another example, an operation unit may be a group of memory cells having any number of memory cells included therein. In some embodiments, the memory cells of the STT-MRAM device 300 may be divided into different operation units according to a mode signal or an address signal provided from outside the STT-MRAM device, or in other words, by an external signal.

An address 320 may be designated by an address designation circuit 330 to select a first operation unit (e.g., 305) and a write enable signal 325 may be applied to the designated address 320. While the operation unit 305 is generally referred to herein as the first operation unit and the operation unit 310 is generally referred to herein as the second operation unit, it will be understood that such reference is for illustrative purposes only, and any other operation unit within the STT-MRAM device 300 may also be referred to as the first operation unit, second operation unit, and so forth.

A first switching current pulse "A" as illustrated in FIG. 3B may be applied to the first operation unit 305 so that data may be written in a plurality of memory cells 315 of the first operation unit 305.

The first switching current pulse "A" may have a current level with which data may be written in a memory cell having the highest switching current in all memory cells in the first operation unit 305 of the STT-MRAM device. That is, the first switching current pulse "A" may have a current level substantially the same as or higher than any switching current required for writing data in any memory cell 315 in the first operation unit 305 of the STT-MRAM device 300.

Thus, a current that is usually sufficient for writing data in any memory cell in the first operation unit may be applied so that spin polarities of free layers of all or substantially all memory cells 315 therein may be aligned in a desired direction.

Figure 4A:
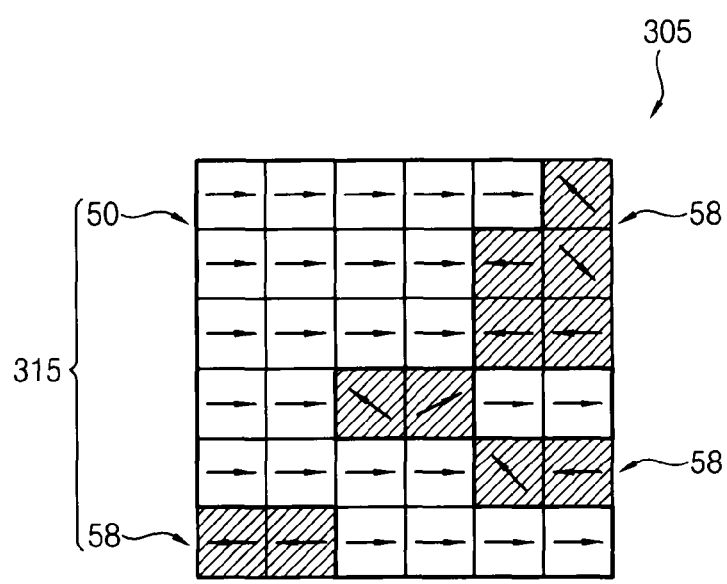
FIG. 4A illustrates spin polarities of memory cells in the first operation unit when the first switching current pulse A is applied.

However, the first switching current pulse "A" may be excessive to some memory cells in which data would otherwise be successfully written even with a current level lower than that of the first switching current pulse "A." Excessive currents may cause Joule heating in some memory cells and an energy barrier of the memory cells may decrease so that spin polarities of free layers of the memory cells may not be aligned properly. Consequently, the spin polarity of the free layers in such memory cells may not be constant and a tunneling resistance may be affected, which is referred to as back hopping. When back hopping occurs, the data may not be successfully written to such memory cells. FIG. 4A illustrates spin polarities of memory cells in the first operation unit 305 when the first switching current pulse "A" is applied. While the memory cells of operation unit 305 as illustrated in FIG. 4A are arranged in rows and columns in a square formation, it will be understood that the memory cells may be arranged in any suitable formation including single rows, single columns, multiple rows, multiple columns, or any combination thereof.

Referring to FIG. 4A, data may be properly written in only some memory cells 50 having a high switching current. The memory cells 50 are referred to herein as a first group of memory cells. Polarity spins of free layers of the first group of memory cells 50 may be aligned properly, indicating that data has been successfully written therein; however, spins of free layers of other memory cells (e.g., 58) may not be aligned properly and thus be irregular. That is, spins of free layers of memory cells having a low switching current may not be aligned properly.

A second switching current pulse "B" having a current level lower than that of the first switching current pulse "A" may be applied so that data may be rewritten in one or more of the memory cells 315 of the first operation unit 305. The second switching current pulse "B" may have a pulse width, e.g., substantially the same as that of the first switching current pulse "A."

When the second switching pulse "B" is applied, data need not be written in the first group of memory cells 50 for which a higher switching current is needed to write data than the second switching current pulse "B." In other words, data may be rewritten in only the memory cells 58. Even if the second switching current pulse "B" is applied to the first group of memory cells 50, data written therein may not be changed and spin polarities of free layers of the first group of memory cells 50 may remain the same.

However, data may be rewritten by the second switching current pulse "B" in other memory cells (e.g., 58) to which an excessive switching current has been applied by the first switching current pulse "A." Thus, spin polarities of free layers of one or more of the memory cells 58 may be aligned properly by the second switching current pulse "B." In other words, data may be properly written in some memory cells in which the second switching current pulse "B" has a proper current level.

However, the second switching current pulse "B" may still be too excessive for some memory cells in which data may be successfully written with a current lower than the second switching current pulse "B." As mentioned above, currents that are excessive for some memory cells may cause Joule heating in such memory cells and the energy barrier of the memory cells may decrease so that spin polarities of free layers of such memory cells may not be aligned properly. Consequently, the spin polarity of the free layers in such memory cells may not be constant and a tunneling resistance may be affected, which as mentioned above, is referred to as back hopping.

As described above, data may be properly written in only some of the memory cells 58 in the first operation unit 305. The memory cells in which data is properly written by the second current pulse "B" are referred to herein as a second group of memory cells 52, as illustrated in FIG. 4B.

Figure 4B:
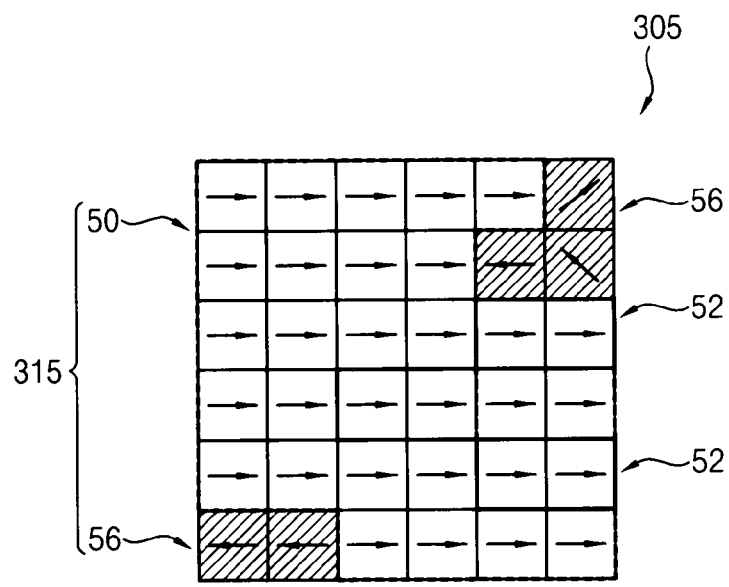
FIG. 4B illustrates spin polarities of memory cells in the first operation unit when the second switching current pulse B is applied.

FIG. 4B illustrates spin polarities of memory cells in the first operation unit 305 when the second switching current pulse "B" is applied.

Referring to FIG. 4B, data written in both of the first and second groups of memory cells 50 and 52, respectively, may maintain the proper spin polarities; however, spin polarities of free layers of other memory cells (e.g., 56) may not be constant or may not have been successfully written.

A third switching current pulse "C" having a current level lower than that of the second switching current pulse "B" may be applied so that data may be rewritten in one or more of the memory cells 315 of the first operation unit 305. The third switching current pulse "C" may have a pulse width, e.g., substantially the same as that of the first switching current pulse "A" and the second switching current pulse "B."

When the third switching pulse "C" is applied, data may be rewritten in only the memory cells 56, or in other words, in memory cells of the first operation unit 305 except for the first and second groups of memory cells 50 and 52, respectively. Data may not be rewritten in the first and the second groups of memory cells 50 and 52, respectively, for which higher switching currents are needed. As mentioned above, the third switching current pulse "C" may have a pulse width substantially the same as that of the first switching current pulse "A."

Data may be properly written in some memory cells (e.g., 56) in which the third switching current pulse "C" has a proper current level. Thus, spin polarities of free layers of all memory cells 315 in the first operation unit 305 may be aligned in the desired direction by the first switching current pulse "A," the second switching current pulse "B," and/or the third switching current pulse "C."

Figure 4C:
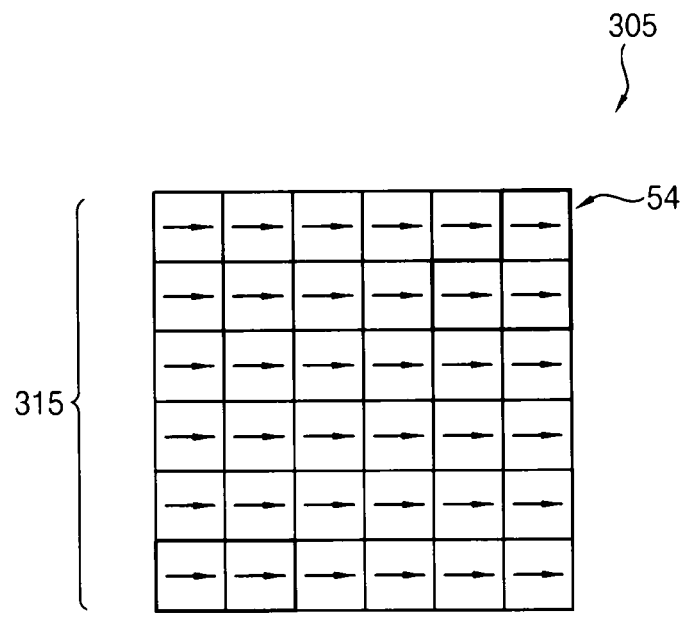
FIG. 4C illustrates spin polarities of memory cells in the first operation unit when the third switching current pulse C is applied.

FIG. 4C illustrates spin polarities of memory cells 315 in the first operation unit 305 after the third switching current pulse "C" is applied.

Referring to FIG. 4C, data written in the first and the second groups memory cells 50 and 52, respectively, may maintain the proper spin polarities, and furthermore, data may be properly written in other memory cells 54.

As described above, switching current pulses may be applied multiple times to write data to memory cells of a particular operation unit, and the switching current pulses may have decreased levels as writing is repeated. Thus, a final switching current pulse applied to the memory cells in the first operation unit 305 may have a lowest current level with which data may be written properly in memory cells having a lowest switching current. In other words, the final switching current pulse (e.g., current pulse "C") may have a current level substantially the same as or lower than that of a switching current pulse required for the memory cells having the lowest switching current in the first operation unit 305.

In the present embodiment, switching current pulses having three different current levels may be applied to memory cells of the first operation unit 305, and thus the third switching current pulse "C" may be the final switching current pulse. However, the number of switching current pulses, i.e., the number of different current levels applied to the memory cells is not limited thereto. In some embodiments, the number of different current levels may be equal to or more than 2. For example, the number of different current levels may be 3, 4, 5, 6 or more, and so forth. If the number of the switching current pulses is decreased, the effect of preventing back hopping may be weakened. If the number of the switching current pulses is increased, a time for writing data in memory cells may increase. Thus, the number of the switching current pulses may be, preferably, from 2 to 5.

In some embodiments, first to n-th switching current pulses are applied to the first operation unit 305 to write data in first to n-th groups of memory cells of the first operation unit 305, respectively. The n-th switching current pulse may have a current level that is lower than that of an (n−1)th switching current pulse, where n is an integer larger than at least 1. Similarly, first to n-th switching current pulses may be applied to the second operation unit 310 to write data in first to n-th groups of memory cells of the second operation unit 310, respectively.

The n-th switching current pulse may have a current level that is lower than that of an (n−1)th switching current pulse, where n is an integer larger than at least 1. The current level of the first switching pulse may be equal to or higher than a current level required for writing data in any memory cell of the first group of memory cells. Moreover, the current level of the n-th switching pulse may be equal to or lower than a current level required for writing data in any memory cell of the n-th group of memory cells.

The integer n and other qualities of the switching pulses may be experimentally determined, as further explained with reference to FIG. 4D.

Figure 4D:
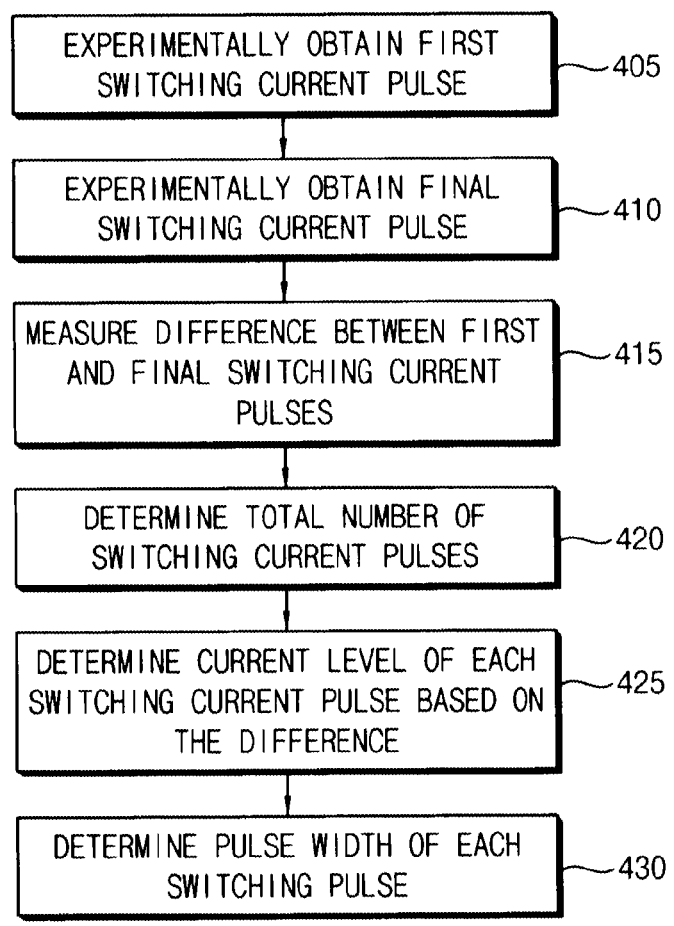
FIG. 4D is a flow diagram illustrating a technique for experimentally determining qualities of different switching current pulses in accordance with example embodiments.

FIG. 4D is a flow diagram illustrating a technique for experimentally determining qualities of different switching current pulses in accordance with example embodiments.

The different switching current pulses applied to memory cells in an operation unit may be determined or otherwise set using data obtained by experiment on an STT-MRAM device. In some embodiments, the first or highest switching current pulse and/or the final or lowest switching current pulse may be determined or otherwise set using data obtained by experiment on the STT-MRAM device. For example, at 405 the first or highest switching current pulse may be experimentally obtained. Similarly, at 410 the final or lowest switching current pulse may be experimentally obtained. In the STT-MRAM device, a level difference of switching current pulses required for writing data may be measured at 415. In other words, the difference between the level of the first switching current pulse and the level of the final switching current pulse may be measured. Additionally, the number of switching current pulses, including the first switching current pulse, the final switching current pulse, and any intervening switching current pulses may be determined at 420 based on the current level difference. Moreover, at 425, a specific current level of each switching current pulse may also be determined or otherwise set using the data obtained by experiment. If the level difference among switching current pulses is large, then the number of switching current pulses may be increased. Conversely, if the level difference among switching current pulses is relatively small, then the number of switching current pulses may be decreased. At 430, the pulse width of each switching pulse may be determined, as further described in detail below.

The above processes may be repeatedly performed on a second operation unit (e.g., 310 of FIG. 3A) of the memory cells in the STT-MRAM device. Further, the above processes may be performed until data may be written in all memory cells of all operation units in the STT-MRAM device.

In the present embodiment, switching current pulses are applied to memory cells; however, in some embodiments, switching voltage pulses may be applied to the memory cells instead of the switching current pulses.

Accordingly, data may be properly written in all memory cells even though the memory cells may have different distribution characteristics.

Figure 5:
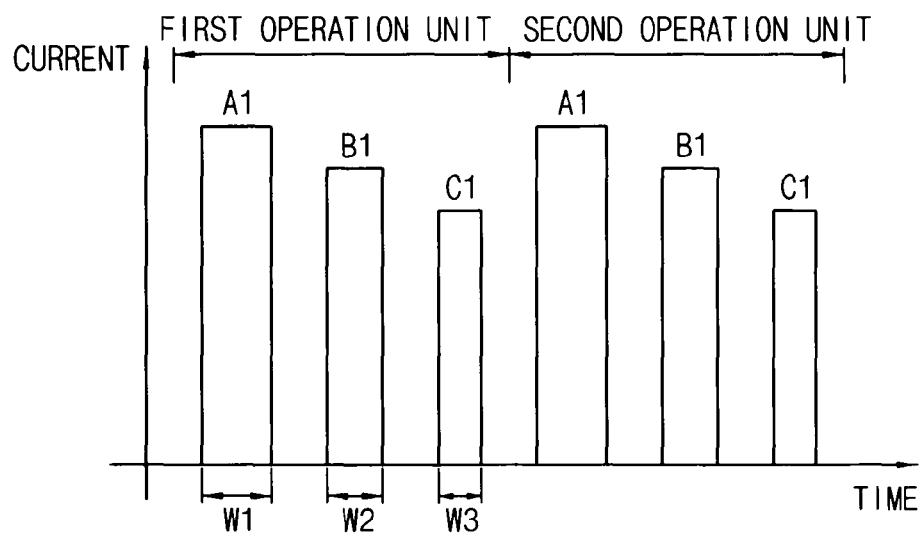

FIG. 5 illustrates switching current pulses applied to memory cells of an STT-MRAM device in accordance with example embodiments.

Referring to FIG. 5, an address (e.g., 320 of FIG. 3A) may be designated to select a first operation unit (e.g., 305), and a writing enable signal (e.g., 325) may be applied to the designated address. A first switching current pulse "A1" having a first current level and a first pulse width "W1" may be applied to the first operation unit so that data may be written in a plurality of memory cells of the first operation unit.

The first switching current pulse "A1" may have a current level and a pulse width with which data may be written in a memory cell having the highest switching current level in all memory cells in the first operation unit 305 of the STT-MRAM device. That is, the first switching current pulse "A1" may have a current level substantially the same as or higher than any switching current required for writing data in any memory cell 315 in the first operation unit 305 of the STT-MRAM device 300.

Thus, a current that is usually sufficient for writing data in any memory cell in the first operation unit may be applied so that spin polarities of free layers of all or substantially all memory cells 315 therein may be aligned in a desired direction.

However, the first switching current pulse "A1" may be excessive to some memory cells in which data would otherwise be successfully written even with a current lower than that of the first switching current pulse "A1." Excessive currents may cause Joule heating in some memory cells and an energy barrier of the memory cells may decrease so that spin polarities of free layers of the memory cells may not be aligned properly. Consequently, the spin polarity of the free layers in such memory cells may not be constant and a tunneling resistance may be affected, which as mentioned above, is referred to as back hopping. When back hopping occurs, the data may not be successfully written to such memory cells.

Data may be properly written in only some memory cells (e.g., 50 of FIG. 4A) having a high switching current, which may be referred to as the first group of memory cells.

A second switching current pulse "B1" having a second current level lower than the first current level and a second pulse width "W2" narrower than the first pulse width "W1" may be applied so that data may be rewritten in one or more of the memory cells 315 of the first operation unit 305.

When data is written in memory cells, Joule heating may be decreased if a switching current pulse having a relatively narrow pulse width is applied. Thus, an energy barrier of a tunneling barrier layer may increase so that a higher switching current may be needed.

When the second switching current pulse "B1" is applied, data need not be written in the first group of memory cells 50.

However, data may be rewritten by the second switching current pulse "B1" in other memory cells (e.g., 58) to which an excessive switching current has been applied by the first switching current pulse "A1." Thus, spins of free layers of one or more of the memory cells 58 may be aligned properly by the second switching current pulse "B1."

In other words, data may be properly written in some memory cells in which the second switching current pulse "B1" has a proper current level. The memory cells may be referred to as the second group of memory cells 58.

However, the second switching current pulse "B1" may still be too excessive for some memory cells in which data may be successfully written with a current lower or a pulse width narrower than the second switching current pulse "B1." Thus, spin polarities of free layers of such memory cells may not be aligned properly.

A third switching current pulse "C1" having a third current level lower than the second current level and a third pulse width "W3" narrower than the second pulse width "W2" may be applied so that data may be rewritten in one or more of the memory cells 315 of the first operation unit 305.

When the third switching pulse "C1" is applied, data may be rewritten in only the memory cells 56, or in other words, in memory cells of the first operation unit 305 except for the first and second groups of memory cells 50 and 52, respectively. Data may not be rewritten in the first and the second groups of memory cells 50 and 52, respectively, for which higher switching currents are needed.

Data may be properly written in some memory cells (e.g., 56) in which the third switching current pulse "C1" has a proper current level. Thus, spin polarities of free layers of all memory cells 315 in the first operation unit 305 may be aligned in the desired direction by the first switching current pulse "A1," the second switching current pulse "B1," and/or the third switching current pulse "C1."

As described above, switching current pulses may be applied multiple times to write data, and the switching current pulses may have decreased levels as writing is repeated. Thus, a final switching current pulse applied to the memory cells in the first operation unit 305 may have a lowest current level with which data may be written properly in memory cells having a lowest switching current. In other words, the final switching current pulse (e.g., current pulse "C1") may have a current level substantially the same as or lower than that of a switching current pulse required for the memory cells having the lowest switching current in the first operation unit 305.

In the present embodiment, switching current pulses having three different current levels may be applied to memory cells of the first operation unit 305, and thus the third switching current pulse "C1" may be the final switching current pulse. However, the number of switching current pulses, i.e., the number of different current levels applied to the memory cells is not limited thereto. In some embodiments, the number of different current levels may be equal to or more than 2. For example, the number of different current levels may be 3, 4, 5, 6, or more, and so forth. If the number of the switching current pulses is decreased, the effect of preventing back hopping may be weakened. If the number of the switching current pulses is increased, a time for writing data in memory cells may increase. Thus, the number of the switching current pulses may be, preferably, from 2 to 5.

The different switching current pulses applied to memory cells in an operation unit may be determined or otherwise set using data obtained by experiment on an STT-MRAM device. In some embodiments, the first or highest switching current pulse and/or the final or lowest switching current pulse may be determined or otherwise set using data obtained by experiment on the STT-MRAM device. In the STT-MRAM device, a level difference of switching current pulses required for writing data may be measured. In other words, the difference between the level of the first switching current pulse and the level of the final switching current pulse may be measured. Additionally, the number of switching current pulses, including the first switching current pulse, the final switching current pulse, and any intervening switching current pulses may be determined at 420 based on the current level difference. Moreover, a specific current level of each switching current pulse and pulse width may also be determined or otherwise set using the data obtained by experiment, as set forth in detail above with reference to FIG. 4D. If the level difference of switching current pulses is large, then the number of switching current pulses may be increased. Conversely, if the level difference among switching current pulses is relatively small, then the number of switching current pulses may be decreased.

The above processes may be repeatedly performed on a second operation unit (e.g., 310 of FIG. 3A) of the memory cells in the STT-MRAM device. Further, the above processes may be performed until data may be written in all memory cells of all operation units in the STT-MRAM device.

In the present embodiment, switching current pulses are applied to memory cells; however, in some embodiments, switching voltage pulses may be applied to the memory cells instead of the switching current pulses.

Accordingly, data may be properly written in all memory cells even though the memory cells may have different distribution characteristics.

Figure 6:
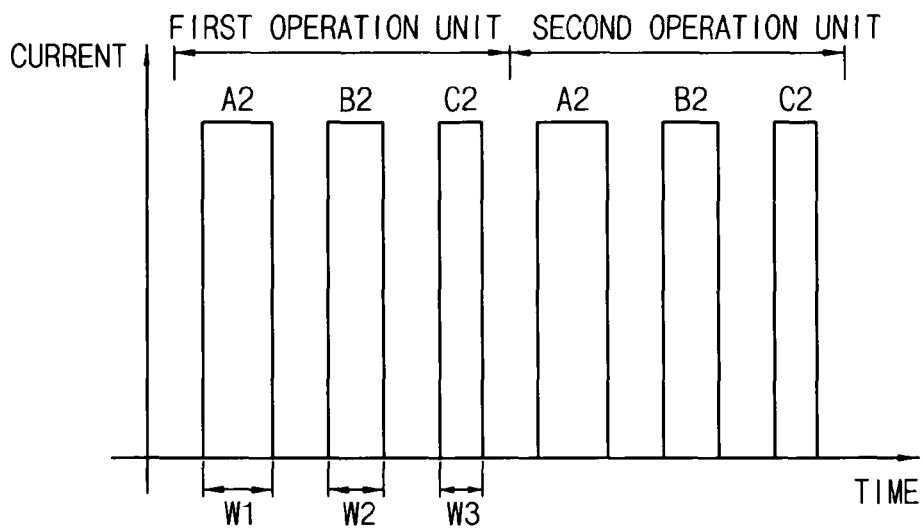

FIG. 6 illustrates switching current pulses applied to memory cells of an STT-MRAM device in accordance with example embodiments.

Referring to FIG. 6, an address (e.g., 320 of FIG. 3A) may be designated to select a first operation unit (e.g., 305), and a writing enable signal (e.g., 325) may be applied to the designated address. A first switching current pulse "A2" having a first current level and a first pulse width "W1" may be applied to the first operation unit so that data may be written in a plurality of memory cells of the first operation unit.

The first switching current pulse "A2" may have a current level and a pulse width with which data may be written in a memory cell having the highest switching current level in all memory cells in the first operation unit 305 of the STT-MRAM device. That is, the first switching current pulse "A2" may have a current level substantially the same as or higher than any switching current required for writing data in any memory cell 315 in the first operation unit 305 of the STT-MRAM device 300.

Thus, a current that is usually sufficient for writing data in any memory cell in the first operation unit may be applied so that spin polarities of free layers of all or substantially all memory cells 315 therein may be aligned in a desired direction.

However, the first switching current pulse "A2" may be excessive to some memory cells in which data would otherwise be successfully written even with a current lower than that of the first switching current pulse "A2." Excessive currents may cause Joule heating in some memory cells and an energy barrier of the memory cells may decrease so that spin polarities of free layers of the memory cells may not be aligned properly. Consequently, the spin polarity of the free layers in such memory cells may not be constant and a tunneling resistance may be affected, as mentioned above, is referred to as back hopping. When back hopping occurs, the data may not be successfully written to such memory cells. Data may be properly written in only some memory cells (e.g., 50 of FIG. 4A) having a high switching current, which may be referred to as the first group of memory cells.

A second switching current pulse "B2" having the first current level and a second pulse width "W2" narrower than the first pulse width "W1" may be applied so that data may be rewritten in one or more of the memory cells 315 of the first operation unit 305.

When data is written in memory cells, Joule heating may be decreased if a switching current pulse having a relatively narrow pulse width is applied. Thus, an energy barrier of a tunneling barrier layer may increase so that a higher switching current may be needed.

The second switching current pulse "B2" may have the second pulse width "W2" narrower than the first pulse width "W1," and thus may have substantially the same effect as a switching current pulse having a current level lower than the first current level.

When the second switching current pulse "B2" is applied, data need not be written in the first group of memory cells 50.

However, data may be rewritten by the second switching current pulse "B2" in other memory cells (e.g., 58) to which an excessive switching current has been applied by the first switching current pulse "A2." Thus, spins of free layers of the one or more of memory cells 58 may be aligned properly by the second switching current pulse "B2."

In other words, data may be properly written in some memory cells in which the second switching current pulse "B2" has a proper pulse width and/or current level. The memory cells may be referred to as the second group of memory cells 58.

However, the second switching current pulse "B2" may still be too excessive for some memory cells in which data may be successfully written with a pulse width narrower than the second switching current pulse "B2." Thus, spin polarities of free layers of such memory cells may not be aligned properly.

A third switching current pulse "C2" having the first current level and a third pulse width "W3" narrower than the second pulse width "W2" may be applied so that data may be rewritten in one or more of the memory cells 315 of the first operation unit 305.

When the third switching pulse "C2" is applied, data may be rewritten in only the memory cells 56, or in other words, in memory cells of the first operation unit 305 except for the first and second groups of memory cells 50 and 52, respectively. Data may not be rewritten in the first and the second groups of memory cells 50 and 52, respectively, for which switching currents having wider pulse widths are needed.

Data may be properly written in some memory cells (e.g., 56) in which the third switching current pulse "C2" has a proper pulse width. Thus, spin polarities of free layers of all memory cells 315 in the first operation unit 305 may be aligned in the desired direction by the first switching current pulse "A2," the second switching current pulse "B2," and/or the third switching current pulse "C2."

As described above, switching current pulses may be applied multiple times to write data, and the switching current pulses may have decreased pulse widths as writing is repeated. Thus, a final switching current pulse applied to the memory cells in the first operation unit 305 may have a narrowest pulse width with which data may be written properly in memory cells having a switching current with a narrowest pulse width. In other words, the final switching current pulse (e.g., current pulse "C2") may have a pulse width substantially the same as or narrower than that of a switching current pulse required for the memory cells having a switching current with a narrowest pulse width in the first operation unit 305.

According to example embodiments, data may be properly written in all memory cells even though the memory cells may have different distribution characteristics. In some embodiments, the number of different current pulse widths may be equal to or more than 2. For example, the number of different current pulse widths may be 3, 4, 5, 6, or more, and so forth.

Figure 7:
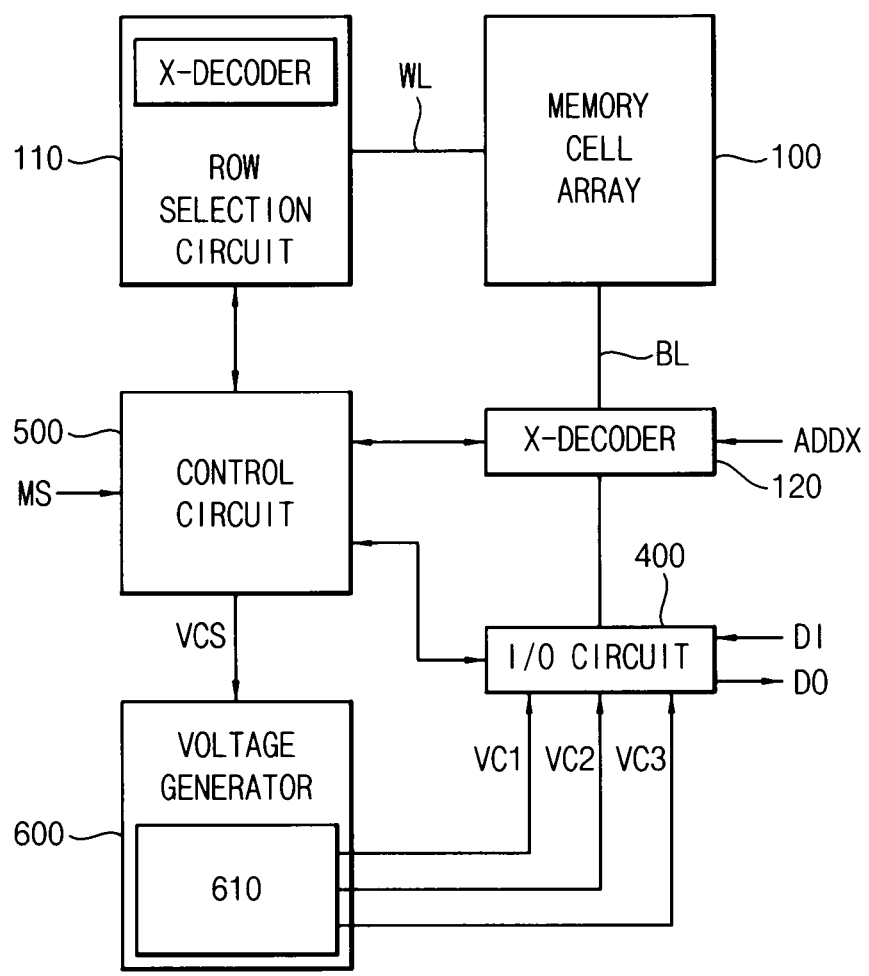

FIG. 7 is a block diagram illustrating an STT-MRAM device in accordance with example embodiments.

Referring to FIG. 7, the STT-MRAM device may include a memory cell array 100, a row selection circuit 110, an X-decoder 120, an input/output (I/O) circuit 400 having a sense amplifier (not shown) and a writing driver (not shown), a control circuit 500 and a voltage generator 600. The STT-MRAM device may further include an address buffer, an input/output buffer, a pre-decoder and/or other peripheral circuits.

The memory cell array 100 may include a plurality of memory cells for storing data therein. The memory cells may be selected by the row selection circuit 110 connected via word lines WLs.

The row selection circuit 110 may include the X-decoder 120, which may select a word line for writing or reading in response to a row address ADDX, and a driver (not shown) for applying voltages to selected and non-selected word lines. Data written in or read from memory cells may be controlled by the X-decoder 120 connected via bit lines BLs and the I/O circuit 400.

The control unit 500 may control input/output of data in response to a mode signal (MS). The mode signal MS may be provided from outside the STT-MRAM device as an external signal, or alternatively, generated based on row and/or column address ADDX and/or ADDY signals.

A control signal generated in the control circuit 500 may be divided into a timing control signal and a voltage control signal. The timing control signal may include a writing enable (WEN) signal, a reading enable (REN) signal, a sense enable (SEN) signal, a discharge (DIS) signal, and so forth. In addition, the voltage control signal may include a second voltage VC2 signal for pre-charge and a first voltage VC1 signal for generating first and second pulses, and so forth. The control circuit 500 may control a generation time and activation time of the timing control signal in accordance with a write operation or a read operation. The timing control signal may be provided to the row selection circuit 110, the X-decoder 120, and/or the I/O circuit 400 for controlling input/output operation.

The voltage control signal may include level signals for a source voltage VCC, a pre-charge voltage (VPRE), a reference voltage (VREF), etc., and the control circuit 500 may control the generation of the voltage control signal in accordance with a write operation or a read operation. The voltage control signal may be provided to the voltage generator 600, and the voltage generator 600 may generate voltages for input/output operation in response to the voltage control signal.

Figure 8:
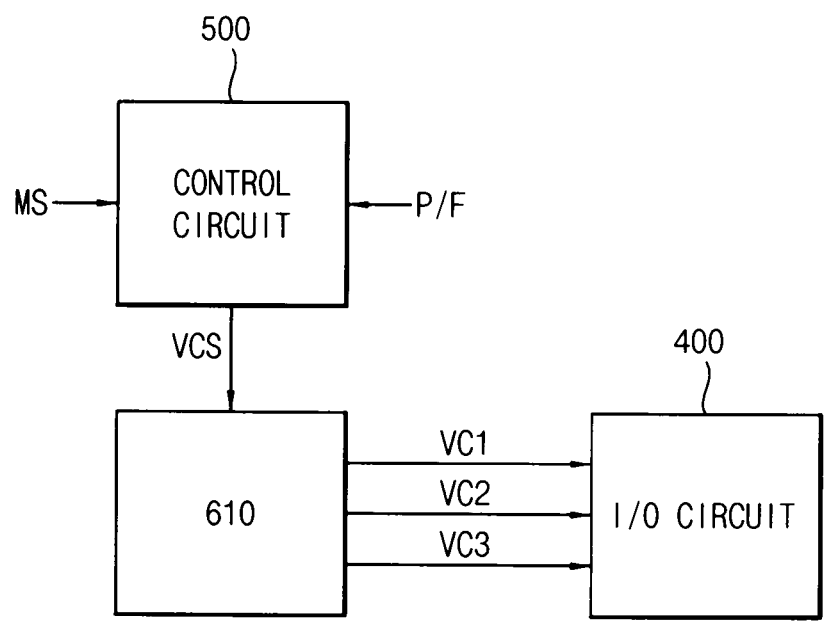

FIG. 8 is a block diagram illustrating a control voltage generation circuit 610 included in the voltage generator 600 of FIG. 7.

Referring to FIG. 8, the control voltage generation circuit 610 may control generation of first, second, and/or third control voltages VC1, VC2 and VC3, respectively.

For example, if a mode signal MS indicates a write operation with a logic-low signal, the control voltage generation circuit 610 may provide the I/O circuit 400 with the first control voltage VC1 in response to the voltage control signal VCS to generate a first switching pulse so that data may be written. The first control voltage VC1 may be provided to the control circuit 500 again to generate the second control voltage VC2. The second control voltage VC2 may be provided to the I/O circuit 400 to generate a second switching pulse so that data may be written. The second switching pulse may have a decreased current level or a decreased pulse width when compared to the first switching pulse, as described in detail above. The second control voltage VC2 may be provided to the control circuit 500 again to generate the third control voltage VC3. The third control voltage VC3 may be provided to the I/O circuit 400 to generate a third switching pulse so that data may be written. The third switching pulse may have a decreased current level or a decreased pulse width when compared to the second switching pulse, as described in detail above. The control circuit may transmit the various switching pulses to the different groups of memory cells as described in detail above.

The control voltage generation circuit 610 may generate a predetermined number of control voltages and control a level of the control voltage. The number of control voltages and the level of the control voltages may be different one from another as described above.

Figure 9:
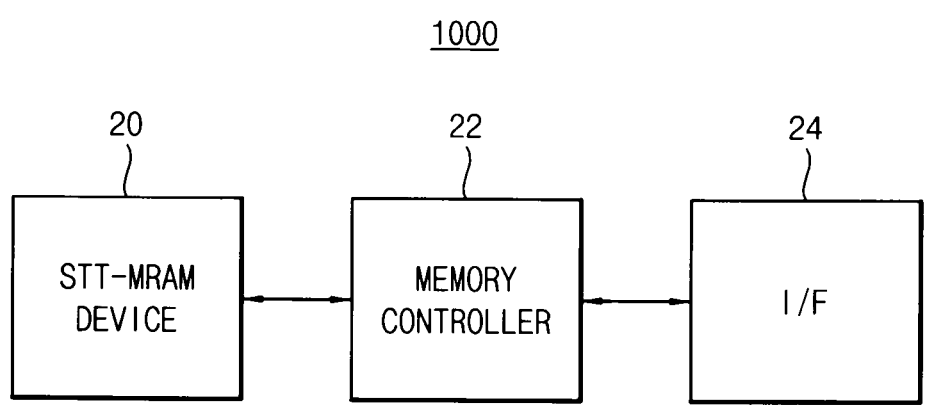

FIG. 9 is a block diagram of a system including the STT-MRAM device in accordance with example embodiments.

Referring to FIG. 9, a system 1000 may include an STT-MRAM device 20 and a memory controller 22. The system 1000 may further include an interface (I/F) 24 for communication with an external device or a user.

The STT-MRAM device 20 may include a plurality of memory cells. The memory controller 22 may control input/output operation of the STT-MRAM device 20.

According to example embodiments, a resistance distribution of memory cells due to Joule heating in writing data therein may be reduced, and thus data may be exactly written.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of writing data in an MRAM device, comprising:
   selecting a first operation unit in a plurality of memory cells of the MRAM device;
   sequentially applying first to n-th switching pulses to the first operation unit to write data in first to n-th groups of memory cells of the first operation unit, respectively, the n-th switching pulse having a current level lower than that of an (n−1)th switching pulse,
   wherein n is an integer larger than at least 1; and
   experimentally determining the current levels of the first to n-th switching pulses by an experiment on a difference between current levels required for writing data in the first to n-th groups of memory cells.

2. The method of claim 1, wherein the first to n-th memory cells have different current levels from each other.

3. A method of writing data in an MRAM device, comprising:
   selecting a first operation unit in a plurality of memory cells of the MRAM device;
   sequentially applying first to n-th switching pulses to the first operation unit to write data in first to n-th groups of memory cells of the first operation unit, respectively, the n-th switching pulse having a current level lower than that of an (n−1)th switching pulse, wherein n is an integer larger than at least 1;
   selecting a second operation unit in the plurality of memory cells of the MRAM device; and
   sequentially applying first to n-th switching pulses to the second operation unit to write data in first to n-th groups of memory cells of the second operation unit, respectively, the n-th switching pulse having a current level lower than that of an (n−1)th switching pulse, wherein n is an integer larger than at least 1.

4. The method of claim 1, further comprising:
   experimentally determining the integer n by an experiment on the MRAM device.

5. The method of claim 1, wherein the current level of the first switching pulse is equal to or higher than a current level required for writing data in any memory cell of the first group of memory cells, and the current level of the n-th switching pulse is equal to or lower than a current level required for writing data in any memory cell of the n-th group of memory cells.

6. The method of claim 1, wherein the switching pulse is a current pulse.

7. The method of claim 1, wherein the first to n-th switching pulses have substantially the same pulse width.

8. The method of claim 1, wherein the n-th switching pulse has a pulse width narrower than that of the (n−1)th switching pulse.

9. The method of claim 1, wherein the first operation unit includes a plurality of memory cells connected to substantially the same word line.

10. The method of claim 1, wherein the first operation unit includes a plurality of memory cells connected to substantially the same bit line.

11. An MRAM device, comprising:
    a memory cell array including a plurality of memory cells;
    an operation unit including some of the memory cells;
    an address designation circuit to designate an address of the operation unit;
    an input/output circuit to write data in the operation unit;
    a control circuit to control the input/output circuit and to sequentially apply first to n-th switching pulses to the operation unit so that data is written in first to n-th groups of memory cells of the operation unit, respectively, the n-th switching pulse having a current level lower than that of an (n−1)th switching pulse,
    wherein n is an integer larger than at least 1, and
    wherein the n-th switching pulse has a pulse width that is less than the (n−1)th switching pulse.

12. The MRAM device of claim 11, wherein the operation unit comprises a first operation unit, the device further comprising:
    a second operation unit including some of the memory cells, wherein:
      the address designation circuit is configured to designate an address of the second operation unit;
      the input/output circuit is configured to write data in the second operation unit; and
      the control circuit is configured to control the input/output circuit and to sequentially apply first to n-th switching pulses to the second operation unit so that data is written in first to n-th groups of memory cells of the second operation unit, respectively, the n-th switching pulse having a current level lower than that of an (n−1)th switching pulse; and
      n is an integer larger than at least 1.

13. The MRAM device of claim 11, wherein:
    the operation unit comprises:
      a first operation unit including a first portion of the memory cells; and
      a second operation unit including a second portion of the memory cells; and
    the control circuit is configured to generate first, second, and third switching pulses in at least one of the first and second operation units, wherein the second switching pulse has a current level that is less than the first switching pulse, and the third switching pulse has a current level that is less than the second switching pulse.

14. The MRAM device of claim 13, wherein the second switching pulse has a pulse width that is less than the first switching pulse and the third switching pulse has a pulse width that is less than the second switching pulse.

15. The MRAM device of claim 13, wherein the control circuit is configured to:
    transmit the first switching pulse to a first group of memory cells in the first operation unit;
    transmit the second switching pulse to a second group of memory cells in the first operation unit; and
    transmit the third switching pulse to a third group of memory cells in the first operation unit, wherein the first group of memory cells is different from the second group of memory cells, and the second group of memory cells is different from the third group of memory cells.

16. The MRAM device of claim 13, wherein the control circuit is configured to:
transmit the first switching pulse to a first group of memory cells in the second operation unit;
transmit the second switching pulse to a second group of memory cells in the second operation unit; and
transmit the third switching pulse to a third group of memory cells in the second operation unit,
wherein the first group of memory cells is different from the second group of memory cells, and the second group of memory cells is different from the third group of memory cells.

17. The MRAM device of claim 13, wherein:
the first switching pulse is configured to align a spin polarity of a first group of memory cells in the first operation unit;
the second switching pulse is configured to align a spin polarity of a second group of memory cells in the first operation unit; and
the third switching pulse is configured to align a spin polarity of a third group of memory cells in the first operation unit,
wherein the first group of memory cells is different from the second group of memory cells, and the second group of memory cells is different from the third group of memory cells.

18. The MRAM device of claim 13, wherein:
the first switching pulse is configured to align a spin polarity of a first group of memory cells in the second operation unit;
the second switching pulse is configured to align a spin polarity of a second group of memory cells in the second operation unit; and
the third switching pulse is configured to align a spin polarity of a third group of memory cells in the second operation unit,
wherein the first group of memory cells is different from the second group of memory cells, and the second group of memory cells is different from the third group of memory cells.

* * * * *